United States Patent
Shiffer et al.

(10) Patent No.: US 7,134,197 B2
(45) Date of Patent: Nov. 14, 2006

(54) PLASTIC LEAD FRAMES UTILIZING REEL-TO-REEL PROCESSING

(75) Inventors: Stephen R. Shiffer, Pearl City, IL (US); Jerry Abramowski, Cedarville, IL (US); Bruce B. Figi, Rockford, IL (US)

(73) Assignee: Honeywell International Inc., Morristown, NJ (US)

( * ) Notice: Subject to any disclaimer, the term of this patent is extended or adjusted under 35 U.S.C. 154(b) by 342 days.

(21) Appl. No.: 10/739,547

(22) Filed: Dec. 18, 2003

(65) Prior Publication Data

US 2005/0136569 A1 Jun. 23, 2005

(51) Int. Cl.
*H05K 3/34* (2006.01)

(52) U.S. Cl. .......................... 29/840; 29/832; 29/841; 29/846; 29/848; 428/209

(58) Field of Classification Search .................. 29/825, 29/832, 841, 846, 848, 840; 428/209, 208
See application file for complete search history.

(56) References Cited

U.S. PATENT DOCUMENTS

| | | | |
|---|---|---|---|
| 3,171,187 A | 3/1965 | Ikeda et al. ................ 29/25.3 |
| 4,584,767 A * | 4/1986 | Gregory ...................... 29/848 |
| 4,641,176 A | 2/1987 | Keryhuel et al. |
| 4,710,419 A * | 12/1987 | Gregory ...................... 428/210 |
| 4,721,453 A | 1/1988 | Belanger, Jr. |
| 5,148,596 A * | 9/1992 | Zahn ............................ 29/842 |
| 5,337,468 A * | 8/1994 | Zahn ............................ 29/842 |
| 5,596,224 A | 1/1997 | Murphy et al. ............. 257/666 |
| 5,616,053 A * | 4/1997 | Bogursky et al. ........... 439/590 |
| 5,619,794 A | 4/1997 | Hokazono .................... 29/883 |
| 5,633,528 A | 5/1997 | Abbott et al. ............... 257/666 |
| 5,725,392 A * | 3/1998 | Bianca et al. ................ 439/590 |
| 5,948,166 A | 9/1999 | David et al. ................ 118/718 |
| 5,957,725 A | 9/1999 | Bianca et al. ............... 439/590 |
| 5,967,841 A * | 10/1999 | Bianca et al. ............... 439/590 |
| 6,003,369 A | 12/1999 | Tola et al. ..................... 73/493 |
| 6,063,139 A | 5/2000 | Fukaya |
| 6,103,135 A | 8/2000 | Kusner et al. |
| 6,171,714 B1 | 1/2001 | Bergkessel et al. ......... 428/618 |
| 6,202,853 B1 | 3/2001 | Bianca et al. |
| 6,258,408 B1 | 7/2001 | Madan et al. ............ 427/255.5 |
| 6,300,577 B1 | 10/2001 | Tsujii |

(Continued)

OTHER PUBLICATIONS

PCT—Notification of Transmittal of The International Search Report and The Written Opinion of the International Searching Authority, or the Declaration, Date of Mailing: Jun. 22, 2005.

*Primary Examiner*—Carl J. Arbes
(74) *Attorney, Agent, or Firm*—Kermit D. Lopez; Richard H. Krukar

(57) ABSTRACT

Reel-to-reel manufacturing methods and systems are disclosed herein. In general, one or more plastic parts (e.g., plastic substrate) can be transported on a carrier for manufacturing of a final product based initially on the part or substrate. A reel-to-reel mechanism is provided comprising one or more reels associated with the carrier, such that the part can be spooled and unspoiled upon the one or more of the reels prior and subsequent to a performance of a manufacturing operation upon the part for the purpose of creating an electronic circuit. A plurality of manufacturing operations can then be subsequently upon the part utilizing the reel-to-reel mechanism to create a final electronic system based upon the part initially subject to the manufacturing operations.

13 Claims, 6 Drawing Sheets

U.S. PATENT DOCUMENTS

| | | | |
|---|---|---|---|
| 6,436,517 B1 * | 8/2002 | Zahn | 428/209 |
| 6,488,777 B1 | 12/2002 | Madan et al. | 118/718 |
| 6,503,831 B1 | 1/2003 | Speakman | 438/674 |
| 6,509,630 B1 | 1/2003 | Yanagisawa | 257/668 |
| 6,518,508 B1 | 2/2003 | Park et al. | 174/255 |
| 6,518,647 B1 | 2/2003 | Tellkamp | 257/646 |
| 6,544,813 B1 | 4/2003 | Lin | 438/107 |
| 6,545,342 B1 | 4/2003 | Abbott | 257/666 |
| 6,545,344 B1 | 4/2003 | Abbott | 257/666 |
| 6,562,709 B1 | 5/2003 | Lin | 438/618 |
| 6,576,493 B1 | 6/2003 | Lin et al. | 438/107 |

* cited by examiner

PLASTIC LEAD FRAMES UTILIZING REEL-TO-REEL PROCESSING

TECHNICAL FIELD

Embodiments are generally related to lead frame and integrated circuit manufacturing processes and operations thereof. Embodiments are also related to reel-to-reel mechanisms.

BACKGROUND OF THE INVENTION

Most electronic packages, which include sensors connected to input/output devices thereof, utilize leadframes, a PCB, or combinations thereof. Such electronic packages generally require that a conductors and/or insulators connect from a sensing element to the outside of the package for a customer to properly interface with the device. Leadframes provide customized configurations in which a designer can create many packages in order to meet a customer's overall need. Unfortunately, all of this customization must link in some electrical means to create a device.

In a typical sensing device, an SOIC may be created to house the die and permit electrical contact for the next operation. In many leadframe designs, the central focus is a "plug", which is the customer's means of connection to the sensing portion of the device. Common methods of connecting to leadframes including wire bonding and soldering techniques. Both of these connecting methods require that the leadframe be plated. Common plating material for wire bonding involves the use of gold, while tin is often utilized for soldering.

A number of complications are involved in the use of leadframes. For example, leadframes require cleaning following stamping and prior to plating in order to remove excessive oils and contaminates. Leadframes also function as a conductor and require an insulator to allow a usable electronic connection. Leadframes additionally require a significant capital investment to produce the conductor. The ability of a leadframe to be manipulated into a desired package configuration is very limited because the method of production chosen typically involves stamping. The simplest leadframe would be flat and straight. Any deviation from the simple design requires significant effort to ensure that angles and bends are precise for not only the package configuration, but also interface with the overmold process.

The over mold process provides the insulation characteristics for the circuit and also the structure required to hold the leadframe. The cost of the mold is greatly influenced not only by its dimensional configuration, but also by the ability to interface with the leadframe. The interface with the leadframe in the mold may be one of the driving factors of circuit costs, because of the consistency required to ensure repeatability, eliminate flash, and prevent leadframe movement. In such processes, 99.9% of the material required to create the electrical connection is wasted. Waste in such processes is found not only what is thrown away via the stamping process, but also, in what is required to create the leadframe.

Leadframes do not optimize material thickness for electrical properties in sensor devices. The thickness driver focuses on requirements for the plug out configuration in the device and necessary requirements involved in the stamping process. Little leeway exists for the package designer to meet the plug connection requirements of the customer while still optimizing the conductor thickness for the sensor, without creating additional electrical joints or increasingly complicated leadframe configuration processes. For example, a customer may require a 0.032" thick plug. The electrical requirements of the device mandate only 0.005 thick materials. Thus, the electrical properties involved in a stamping manufacturing process may be impossible to achieve due to stamping constraints, as well as handling complications.

A PCB (Printed Circuit Board) has become an economical means for producing circuitry utilizing copper foil, fiberglass, and resin to create the insulated conductor. This method maximizes the efficiency of the conductor when compared to the leadframe, because the conductor material requirement comes closer to meeting the electrical requirements required by the circuit. Yet, PCB issues include the cost of the board when the size becomes large. In addition, the conductor is merely flat. Also, a requirement exists to provide an interconnect to the PCB in order to interface with the customer's I/O. Due to the standardization of PCBs, the designer must attempt to optimize the area within the panel. Additionally, routing may be required, not only to give the PCB dimensional size, but also to disconnect from the panel. Typically, additional structures are required to not only to hold the PCB in place, but also to maintain the plug.

It can therefore be very difficult to separate leadframes from PCBs, because of the interaction required to configure sensing devices. A unique method of creating conductors for electronic packages is the MID (molded interconnected device) technique. Such a method creates the conductor and the insulator by utilizing two different plastics in which one can be plated, while the second plastic (i.e., the insulator) can be molded over the plateable plastic, creating a pattern for the circuitry.

Unfortunately, such process requires two molds to create the circuitry. The capital investment of such processes is similar to the leadframe method wherein the conductive plastic is inserted into a mold and all the variation of both conductive plastic and the mold from the second plastic must interface precisely. After the over molding process, the package is plated to create the electrical traces required for the circuitry. The precision of such traces is equal to the precision of the mold, which interfaces to plastics. Although the MID technique permits increasingly complicated traces in leadframe designs, a number of issues are related to the MID method.

MID operations typically require two molds, along with a high precision for interfacing the two molds to obtain higher resolution of traces. A great deal of handling is also required to produce the circuitry. MID operations also typically lack automation, which is desirable in order to provide manufacturing ease of assembly.

A second plastic circuitry method utilizes a photomask to develop a circuit. This only requires one mold to produce the substrate. The creation of the other circuitry is accomplished by photo, masking, and etching techniques. This method permits, 3-D circuitry not only for one mold, but also permits the change of the circuitry without changing the plastic substrate configuration. This key flexibility permits multiple circuit configurations to be created from one base package without the complications of additional capital expenditure or process modification. Circuitry is merely altered by providing a new photomask. Another benefit of this process is a high resolution in the trace width.

Issues with this process include lack of automation, and a requirement for handling between processes to create the circuitry. Angles are also required to configure the circuitry in a 3-D mode. Complications can also be encountered when creating multiple parts and a panel assembly, while still maintaining the circuitry resolution that would be seen on a single part in high volumes.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide improved leadframe and IC manufacturing processes and operations thereof.

It is another aspect of the present invention to provide for reel-to-reel manufacturing methods and systems.

The aforementioned aspects of the invention and other objectives and advantages can now be achieved as described herein. Reel-to-reel manufacturing methods and systems are disclosed herein. In general, one or more parts (e.g., plastic parts) can be transported on a carrier for manufacturing of a final product based initially on the part. A reel-to-reel mechanism is provided comprising one or more reels associated with the carrier, such that the part can be spooled and unspoiled upon the one or more of the reels prior and subsequent to a performance of a manufacturing operation upon the part. A plurality of manufacturing operations can then be subsequently upon the part utilizing the reel-to-reel mechanism to create a final product based upon the part initially subject to the manufacturing operations.

The embodiments disclosed herein therefore describe a manufacturing system using plastic circuitry fabrication techniques and reel-to-reel processes. The reel-to-reel is found in a number of leadframe devices to reduce the cost of handling and secondary operations as it associates with plating and plastic molding. This innovation centers on circuitry created in plastic and providing automation to not only reduce the costs but reduce the variation.

In a reel-to-reel process, the individual units or packages, which are a portion of the overall device, are transported on a carrier allowing the numerous units to be rolled into a reel. As described herein, the reeling and unreeling of units is only required if there is a break in the manufacturing process. Theoretically, an entire string of units may be processed from the beginning of the manufacturing process of the device to the end on a single carrier without interruption. The speed of this process is dictated by the slowest process. The complications of creating a single line are due to the investment of capital, the utilization of machinery, and floor space. As a result, the reel-to-reel method permits quick setups and easy transportation of units through the processes, because there are tooling points, which allow orientation.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate at least one embodiment of the present invention and are not intended to limit the scope of the invention.

Figure 1:
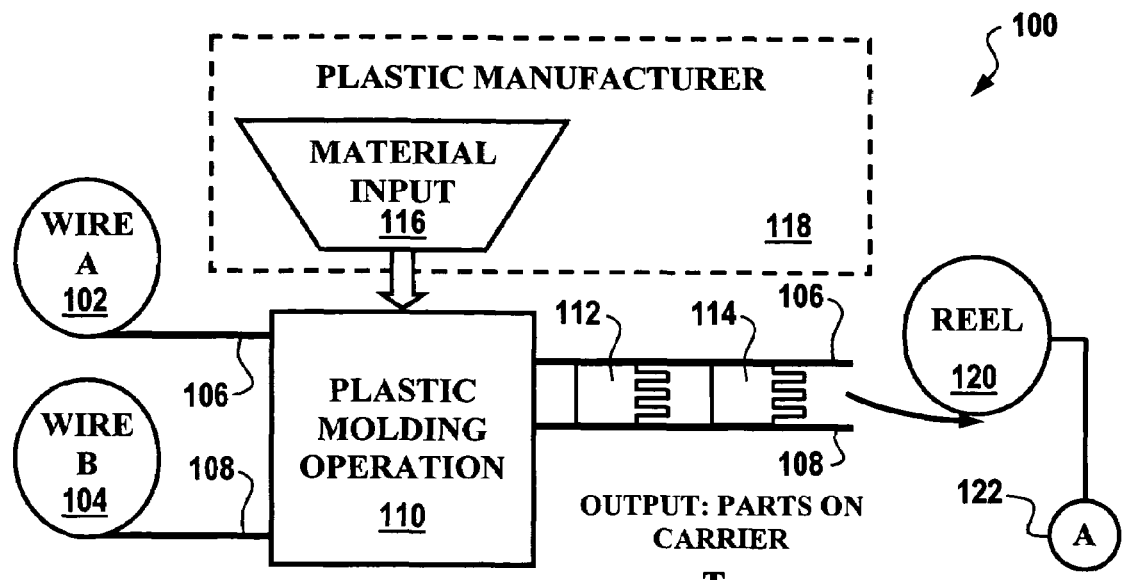
FIG. 1 illustrates a block diagram illustrative of a plastic molding operation and a reel-to-reel mechanism, which can be implemented in accordance with a preferred embodiment of the present invention.

FIG. 1 illustrates a block diagram of a system 100 that includes a plastic molding operation and a reel 120 of a reel-to-reel mechanism, which can be implemented in accordance with a preferred embodiment of the present invention. Note that FIGS. 1 to 8 depicted and described herein represent a preferred embodiment, while FIGS. 9 to 18 represent an alternative embodiment. In FIGS. 1 to 8, identical or similar parts are generally indicated by identical reference numerals. FIGS. 1 to 8 represent sequential manufacturing operations, beginning with the operations of system 100 and continuing to the operations of system 200 of FIG. 2, and so forth. Note that in general, FIGS. 1–8 represent a photo plating process of producing a circuit utilizing a reel to reel system, while FIGS. 9–18 utilize the MID or two mold method with the reel to reel process.

Figure 2:
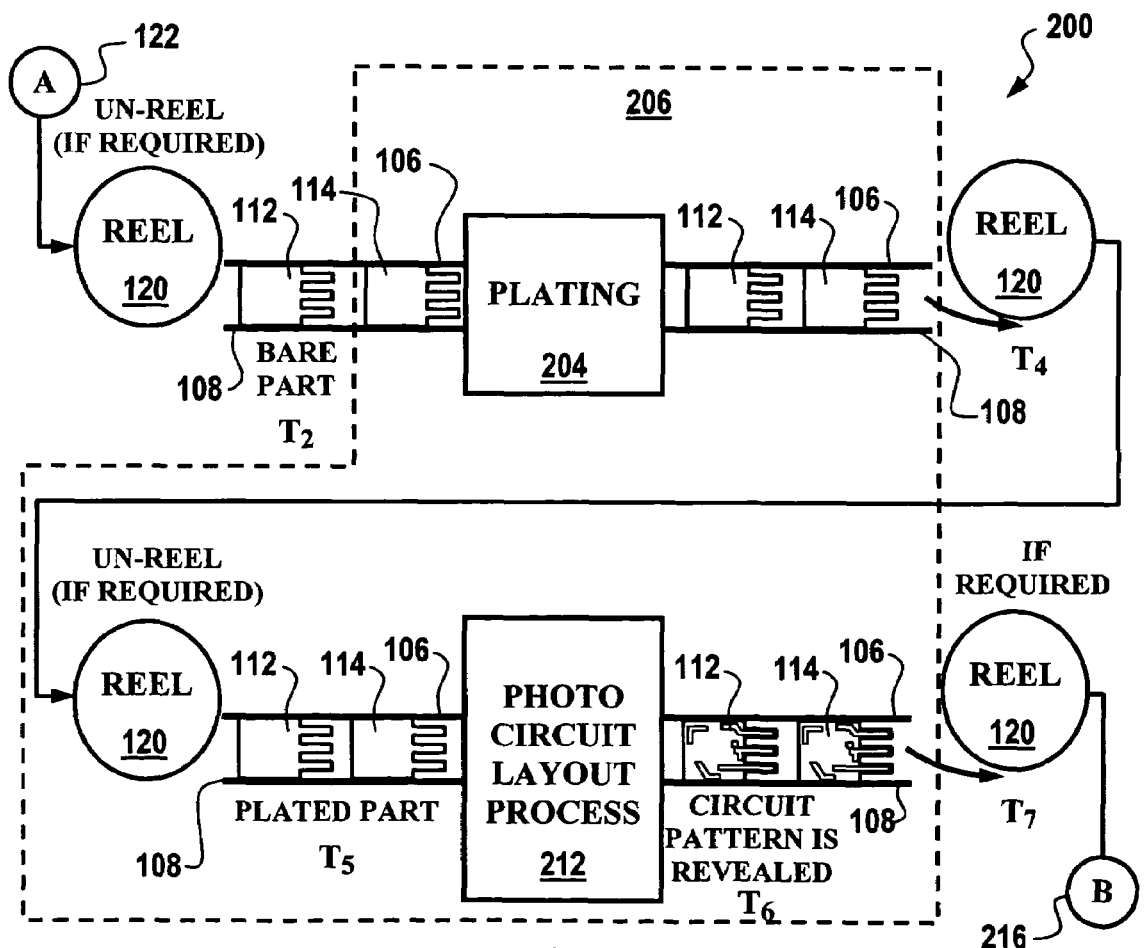
FIG. 2 illustrates a block diagram illustrative of plating and photo circuit layout operations in association with a reel-to-reel mechanism, in accordance with a preferred embodiment of the present invention.

FIG. 2 illustrates a block diagram of a system 200 illustrative of plating and photo circuit layout operations in association with reel 120 of a reel-to-reel mechanism, in accordance with a preferred embodiment of the present invention. System 200 can be implemented partially within an area 206, which can constitute a proprietary portion of the manufacturing process.

System 100 includes a wire 102 (i.e., wire A) and a wire 104 (i.e., wire B) which are associated respectively with carriers 106 and 108, which may be formed from wire extending from wires 102 and 104. It can be appreciated that although in this context, wire is discussed with respect to a preferred embodiment, carriers can also be formed from other materials, such as Mylar, stamping, plastic links, and so forth. For illustrative purposes, however, wire is discussed herein. Carriers 106 and 108 are linked to a plastic molding module 110, which can be fed plastic material 116 provided by a plastic manufacturer 118. Plastic molding module 110 implements a plastic molding operation. Following processing of the plastic molding operation via module 110, plastic parts 112 and 114 are generated and as output and carried upon carriers 106 and 108. Parts 112 and 114 can then be spooled on reel 120. Note that spooling via reel 120 is an optional operation and can be used to permit linkage to the next process, which is depicted in process 200 of FIG. 2. The process depicted in FIG. 1 continues in FIG. 2, as indicated by continuation block 122.

Note that the term "module" as utilized herein can refer both to a physical module (e.g., hardware or manufacturing components) and/or a software or process module that performs a particular task based upon a set of particular instructions stored in a memory of a data-processing system, such as a computer, and processible via a processor, such as, for example, a microprocessor or central processing unit (CPU). Thus, the term "module" can refer to a collection of routines and data structures that can implement a particular task or abstract data types, and can also be referred to as a "software module".

Software modules can be composed of two parts. First, a software module may list the constants, data types, variable, routines and the like that that can be accessed by other modules or routines. Second, a software module can be configured as an implementation, which can be private (i.e., accessible perhaps only to the module), and that contains the source code that actually implements the routines or subroutines upon which the module is based. Thus, for example, the term module, as utilized herein can refer to software modules or implementations thereof. Such modules can be utilized separately or together to form a program product that can be implemented through signal-bearing media, including transmission media and recordable media.

The term "module" can also refer, however, to a self-contained hardware component that provides a complete function into a system and be interchanged with and/or function in association with other modules that provide other functions. Such modules can be referred to also as "hardware modules". The term "module" as utilized herein can thus refer to both hardware or software modules and/or a combination thereof.

An un-reel operation can be implemented via reel 120 and the bare parts 112 and 114 are carried along the carriers, as indicated at time $T_2$. Parts 112 and 114 can be subject to a plating operation via a plating module 204. In the example of FIG. 2, copper can be plated for a base. Note that copper is referenced only as an example with respect to particular embodiments of the prevent invention. Other materials may be plated in place of copper. The plating operation implemented via plating module 204 can be based on a reel-to-reel or batch manufacturing operation. As indicated at time $T_3$, parts 112 and 114 are now plated and can thereafter, as depicted at time $T_4$, be spooled on reel 120. Reeling via reel 120 is an optional operation and may be utilized to permit linkage to the next processes, which are indicated at times $T_5$ and $T_6$.

The plated parts can be unreeled (i.e., if required) utilizing reel 120, as indicated at time $T_5$ and thereafter subject to a photo-circuit layout operation via a photo-circuit layout module 212. The photo process can be created utilizing a CAD file. Masking patterns can be accomplished with one or multiple reel processing, depending upon design choices. As indicated at time $T_6$, parts 112 and 114 can be subject to a pattern created thereon in the form of a mask, which may be a positive or a negative mask. Note that a stripping module can be optionally implemented for stripping parts 112 and 114 to reveal a circuit pattern thereof, as also indicated at time $T_6$. Thereafter, as indicated at time $T_7$, parts 112 and 114 can be subject to a reeling operation via reel 120 (i.e., again, if required). The process then continues, as indicated at continuation block 216, which is also depicted in FIG. 3.

Figure 3:
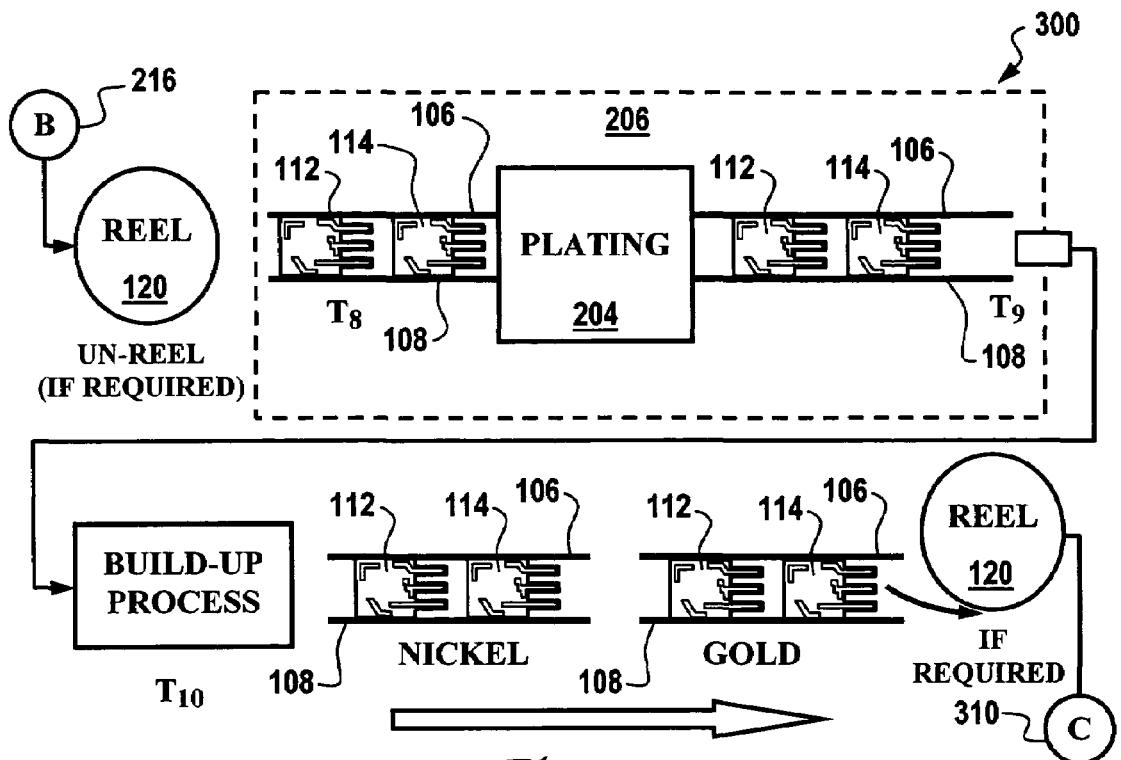
FIG. 3 illustrates a block diagram illustrative of stripping and build-up operations in association with a reel-to-reel mechanism, in accordance with a preferred embodiment of the present invention.

FIG. 3 generally illustrates a block diagram illustrative of a process 300 that includes stripping and build-up operations in association with a reel-to-reel mechanism, in accordance with a preferred embodiment of the present invention. Thus, the process continues, as indicated at continuation block 216. Reel 120 can be utilized to un-reel parts 112 and 114 as indicated at time $T_8$. Parts 112 and 114 can then be subject to plating via plating module 204. The parts are then indicated following the plating operation via plating module 204, as indicated at time $T_9$. Next, as indicated at time $T_{10}$, a build-up process can be implemented via a build-up module 307. After the base plating occurs, a build-up operation can be implemented to create a final usable circuit upon parts 112 and 114 via a build-up module 307.

In the example depicted in FIG. 3, nickel and gold are added. Such a build-up operation may permit a continuous reel to attain the final plated configuration. Alternatively, multiple unreeling/reeling operations can be implemented utilizing reel 120. Plating may occur via bulk or reel-to-reel processing, depending upon desired embodiments. All plating processes such as etching, cleaning, rinsing, and plating can be included as part of the plastic metallization processes depicted in FIGS. 1–8. Following a reeling operation via reel 120 (i.e., if required), the process continues, as indicated at continuation block 310.

Figure 4:
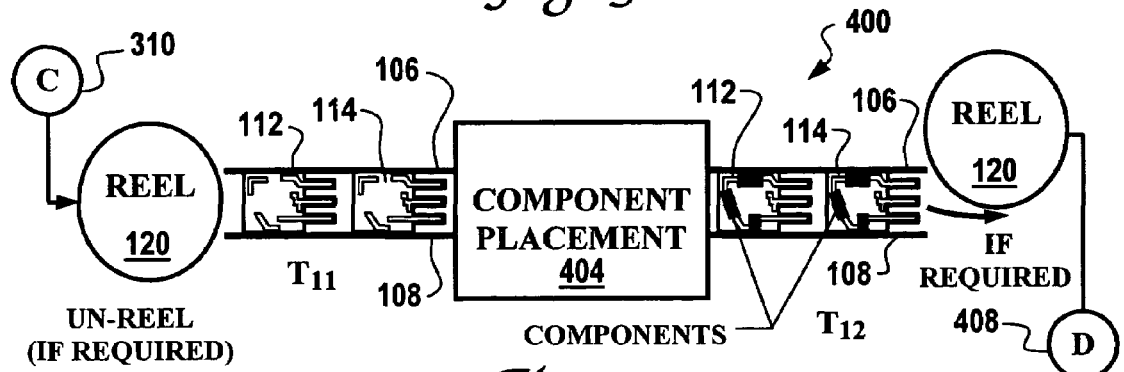
FIG. 4 illustrates a block diagram illustrative of a component placement operation in association with a reel-to-reel mechanism, in accordance with a preferred embodiment of the present invention.

FIG. 4 illustrates a block diagram illustrative of process 400 that includes a component placement operation in association with a reel-to-reel mechanism, in accordance with a preferred embodiment of the present invention. In FIG. 4, an un-reeling operation may be implemented (i.e., if required) via reel 120. As indicated at time Tar, parts 112 and 114 can continue to be carried toward the next processing step, which involves component placement, via a component placement module 404.

Components can be attached to the plastic lead frame structure of parts 112 and/or 114 by a variety of possible techniques to establish electrical connections thereof. Recall that parts 112 and 114 can be configured as plastic lead frames. Such techniques can include, for example, soldering, conductive adhesive techniques, ultrasonic welding, and/or pressure contacts. The components are indicated thereafter integrated with and/or connected to parts 112 and 114 at time $T_{12}$, immediately prior to reeling (i.e., if required) via a reel 120. The process then continues, as indicated at continuation block 408.

Figure 5:
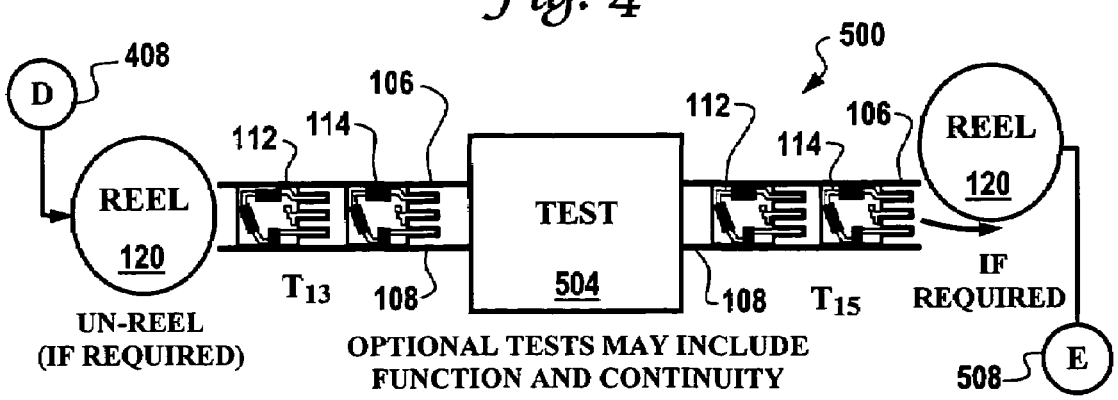
FIG. 5 illustrates a block diagram illustrative of a testing operation in association with a reel-to-reel mechanism, in accordance with a preferred embodiment of the present invention.

FIG. 5 illustrates a block diagram illustrative of a system 500 involving a testing operation in association with a reel-to-reel mechanism, in accordance with a preferred embodiment of the present invention. An un-reeling operation can be implemented via reel 1202 (i.e., if required). Parts 112 and 114 are shown in FIG. 5 at time $T_{13}$, prior to implementation of an optional testing operation via a testing module 504. Tests performed via testing module 504 can include, for example, function and continuity testing. Parts 112 and 114 are thereafter shown in FIG. 5 at time $T_{14}$, prior to reeling via a reel 120 (i.e., if required). The process then continues, as indicated at block 508.

Figure 6:
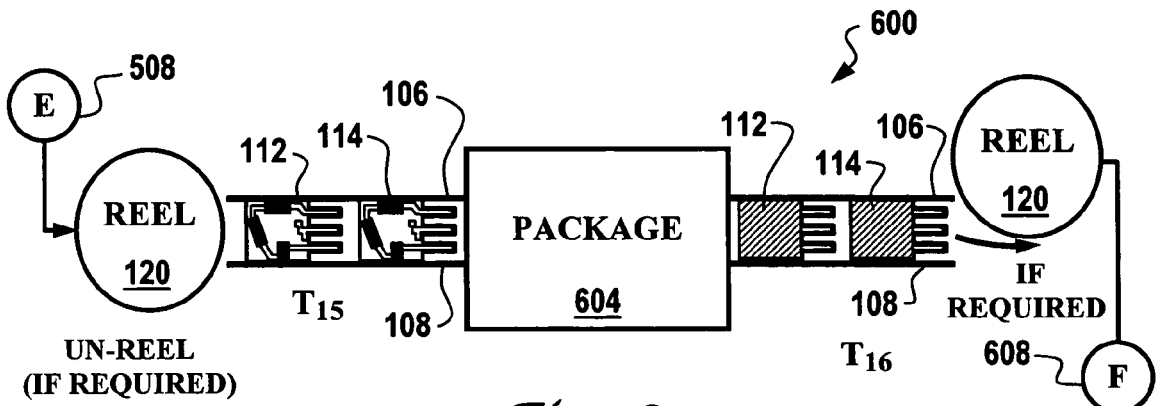
FIG. 6 illustrates a block diagram illustrative of a packaging operation in association with a reel-to-reel mechanism, in accordance with a preferred embodiment of the present invention.

FIG. 6 illustrates a block diagram illustrative of a system 600 that includes a packaging operation in association with a reel-to-reel mechanism, in accordance with a preferred embodiment of the present invention. An un-reeling operation can be implemented via reel 120. Parts 112 and 114 are shown in FIG. 6 at time $T_{15}$, prior to implementation of a packaging operation via a packaging module 604. Packaging can take into account a variety of operation forms, including, for example, sealing, thermal packaging, structure built-in seals, and/or vibration isolation. Packaging module 604 can implement more than one packaging operational step and may require that reel 120 be spooled and re-spooled. Parts 112 and 114 are thereafter depicted in FIG. 6 at time $T_{16}$ prior to optional reeling via reel 120. The process can then continue, as indicated at continuation block 608.

Figure 7:
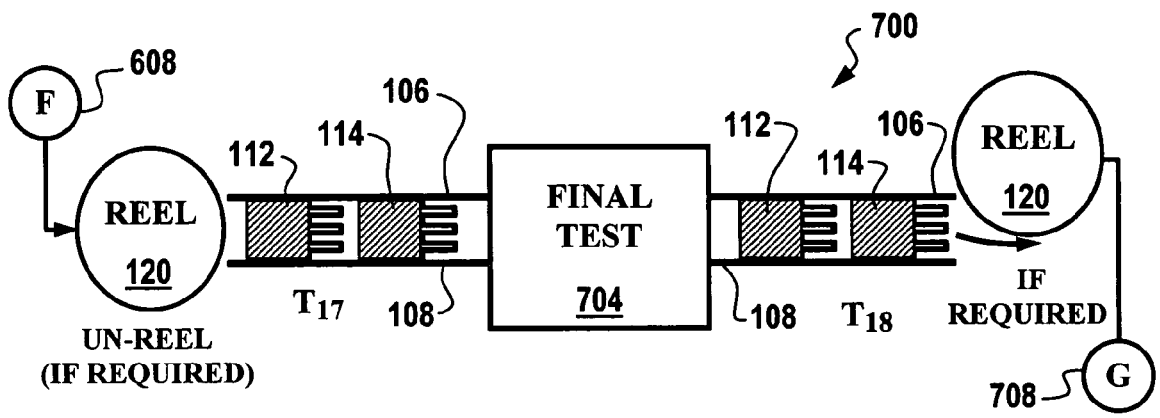
FIG. 7 illustrates a block diagram illustrative of a final testing operation in association with a reel-to-reel mechanism, in accordance with a preferred embodiment of the present invention.

FIG. 7 illustrates a block diagram illustrative of a system 700 that includes a final testing operation in association with a reel-to-reel mechanism, in accordance with a preferred embodiment of the present invention. Reel 120 can be utilized to implement an un-reeling operation (i.e., if required). Parts 112 and 114 are depicted in FIG. 7 at time $T_{17}$ prior to subjugation to a final testing operation, which can be implemented via a testing module 704. A number of tests are required prior to shipment. Such a testing operation can, however, be optionally performed following a singulation operation, which is depicted subsequently in FIG. 8. Parts 112 and 114 are shown in FIG. at time $T_{18}$ following testing module 704 and prior to reeling via reel 120. Note that reeled parts can be shipped to a customer interface with the customer's automated equipment. The process then continues, as indicated at block 708.

Figure 8:
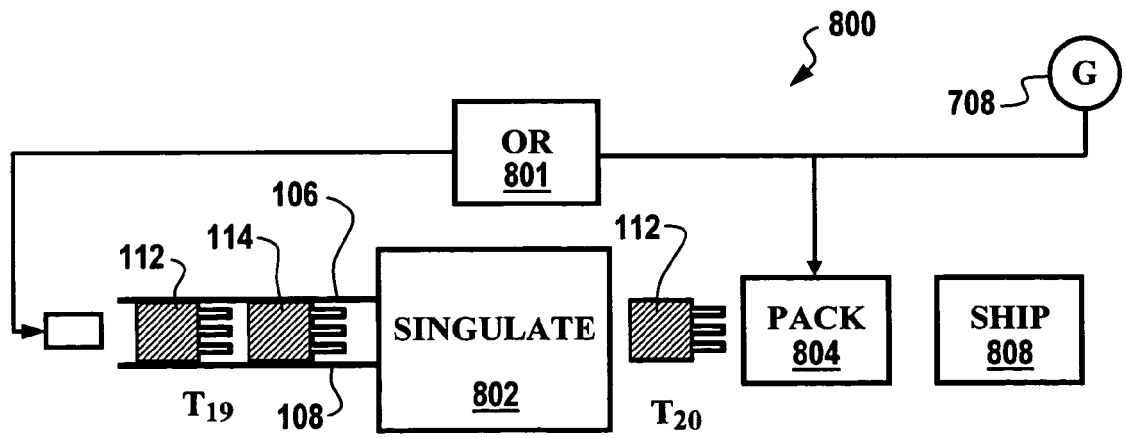
FIG. 8 illustrates a block diagram illustrative of packing and shipping operations, in accordance with a preferred embodiment of the present invention.

FIG. 8 illustrates a block diagram illustrative of a system 800 that includes packing and shipping operations, in accordance with a preferred embodiment of the present invention. Parts 112 and 114 are shown in FIG. 8 at time Tag, prior to implementation of a singulation operation via a singulating module 802. Note that an optional "OR" block 801 is also indicated in FIG. 8, which indicates that the implementation of singulation module 802 is optional. The parts (e.g., part 112 depicted at time $T_{20}$) can simply be directly subject to a packaging operation via packaging module 804 following by shipping via a shipping module 808.

Note that in FIGS. 1 to 8, systems 100–800 illustrated therein can constitute an overall system in which parts are reeled/un-reeled, coiled/uncoiled, spooled/unspoiled in and out of various processes implemented respectively via various modules. The desire of the embodiment of FIGS. 1 to 8 is to accomplish -an entire manufacturing process with the fewest reel-handling operations as possible. The reels depicted in FIGS. 1 to 8 can be implemented as multiple reels, a single reel, or only two reels, depending upon design constraints and goals. For example, instead of utilizing a single reel 120, one or more reels may also be utilized to accomplish both reeling and unreeling operations. The use of a single or multiple reel configurations again depends on the goals of the manufacturing operation.

Figure 9:
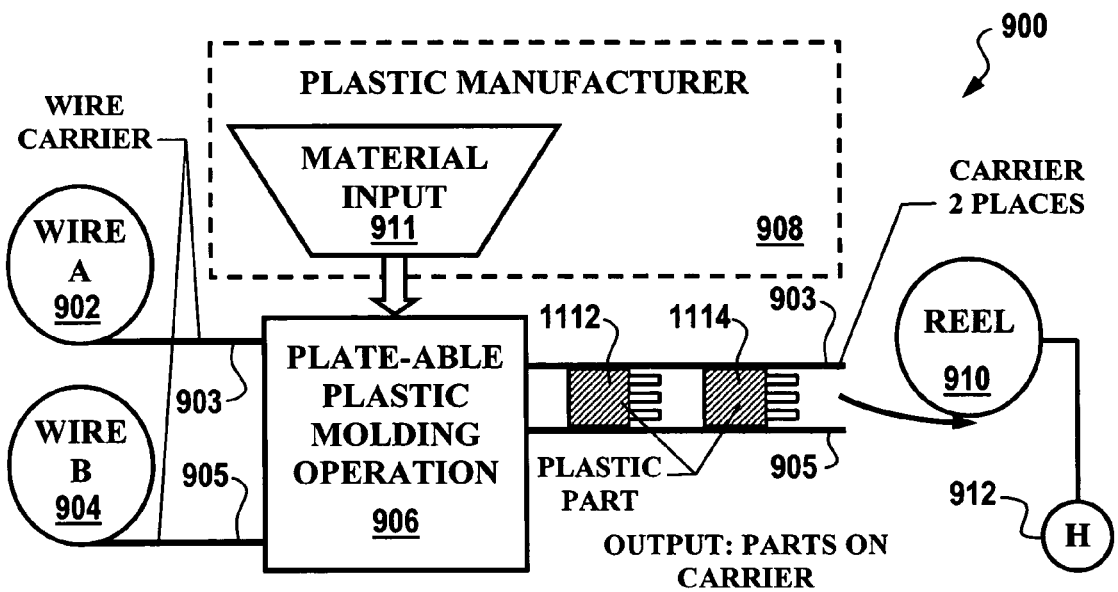
FIG. 9 illustrates a block diagram illustrative of a plastic molding operation in association with a reel-to-reel mechanism, in accordance with an alternative embodiment of the present invention.

FIG. 9 illustrates a block diagram illustrative of a system 900 that includes a plastic molding operation in association with a reel-to-reel mechanism, in accordance with an alternative embodiment of the present invention. In FIGS. 9 to 18, identical or similar parts are generally indicated by identical reference numerals. FIGS. 9 to 18 represent sequential manufacturing operations, beginning with the operations of system 900 and continuing to the operations of system 1000 of FIG. 10, and so forth.

System 900 includes a wire 902 (i.e., wire A) and a wire 904 (i.e., wire B) which are associated respectively with carriers 903 and 905, which may be formed from wire extending from wires 902 and 904. It can be appreciated that although in this context, wire is discussed with respect to a preferred embodiment, carriers can also be formed from other materials, such as Mylar, stamping, plastic links, and so forth. For illustrative purposes, however, wire is discussed herein. Carriers 903 and 905 are linked to a plate-able plastic molding module 906, which can be fed plastic material 911 provided by a plastic manufacturer 908. Plastic material 911 is provided as raw material, which may be in the form of thermoplastic or thermo set material.

Plastic molding module 906 generally implements a plastic molding operation. Following processing of the plastic molding operation via module 906, plastic parts 1112 and 1114 are generated as output and carried upon carriers 903 and 905 as indicated at time $T_1$ of FIG. 9 Parts 1112 and 1114 can then be spooled utilizing reel 910. Note that spooling via reel 910 is an optional operation and can be used to permit linkage to the next process, which is depicted in system 1000 of FIG. 10. The process depicted in FIG. 9 continues in FIG. 10, as indicated by continuation block 912.

Figure 10:
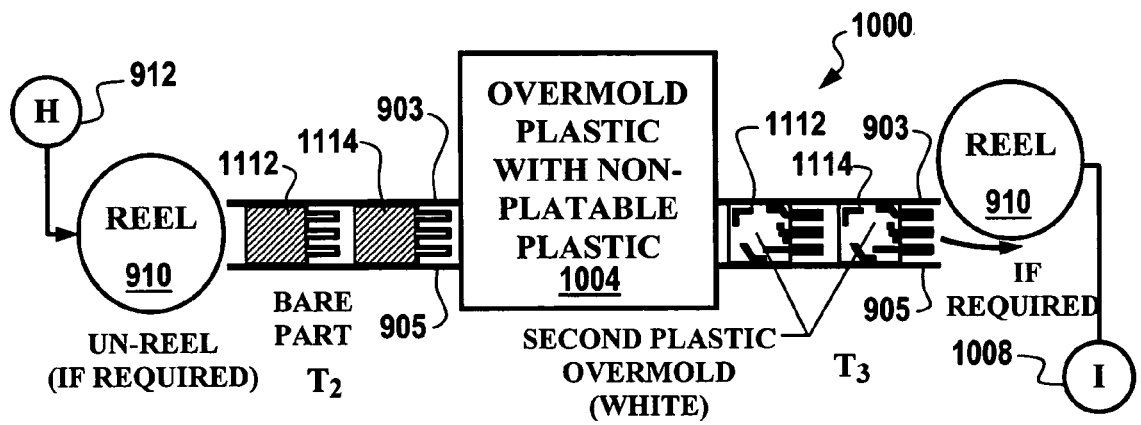
FIG. 10 illustrates a block diagram illustrative of an over-mold operation in association with a reel-to-reel mechanism, in accordance with an alternative embodiment of the present invention.

FIG. 10 illustrates a block diagram illustrative of a system 1000 that includes an over-mold operation in association with a reel-to-reel mechanism, in accordance with an alternative embodiment of the present invention. Bare parts 1112 and 1114 are illustrated in FIG. 10 at time $T_2$, following un-reeling via reel 910 (i.e., if required). Parts 1112 and 1114, which at this point in the process are configured as bare plastic lead frame structures can then be subject to an over-molding operation via a molding module 1004, wherein the plastic of parts 1112 and 1114 is over-molded with non-plateable plastic. Parts 1112 and 1114 are thereafter indicated at time T3 with a second plastic over-mold. Parts 1112 and 1114 can then be spooled on reel 910. Note that spooling via reel 1006 is an operation operational and may be used to permit linkage to the next process, which continues in FIG. 11, as indicated at continuation block 1008 of both FIGS. 10 and 11.

Figure 11:
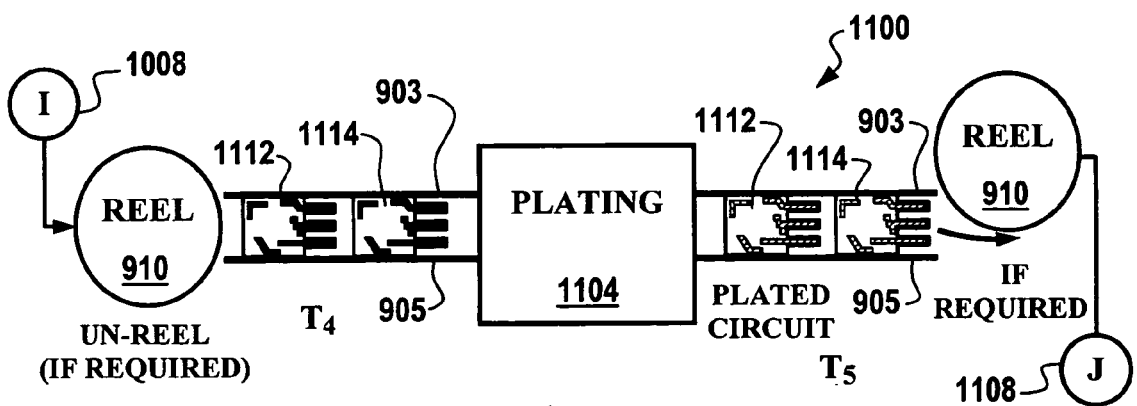
FIG. 11 illustrates a block diagram illustrative of a plating operation in association with a reel-to-reel mechanism, in accordance with an alternative embodiment of the present invention.

FIG. 11 illustrates a block diagram illustrative of a system 1100 that includes a plating operation in association with a reel-to-reel mechanism, in accordance with an alternative embodiment of the present invention. Parts 1112 and 1114 are depicted in FIG. 11 at time $T_4$, following an un-reeling operation implemented via reel 9102 (i.e., if required). Parts 1112 and 1114 can then be subject to a plating operation, which may be a reel-to-reel or batch plating operation implemented via a plating module 1104. In the example of FIG. 11, copper may be plated. It can be appreciated, of course, that other metals can be plated in place of or in addition to copper. The plated circuitry is thereafter indicated on parts 1112 and 1114 at time $T_5$. Thereafter, if required, a reeling operation can be implemented via reel 910. The process can then continue, as indicated at continuation block 1108.

Figure 12:
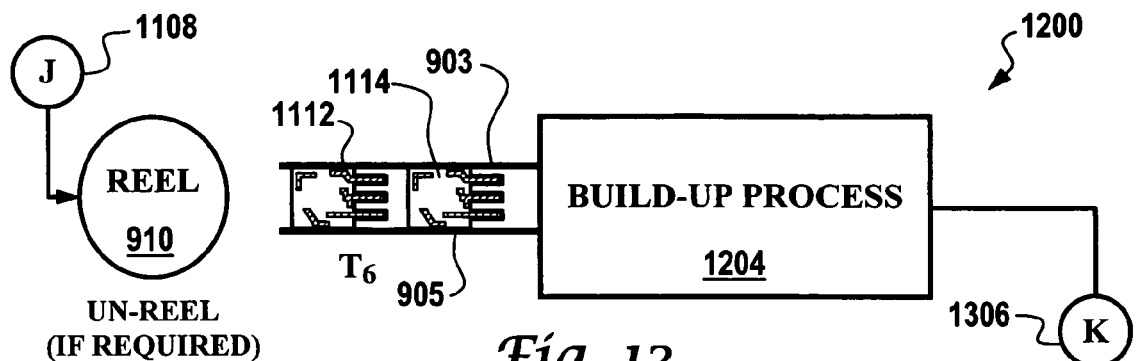
FIG. 12 illustrates a block diagram illustrative of a build-up operation in association with a reel-to-reel mechanism, in accordance with an alternative embodiment of the present invention.
Figure 13:
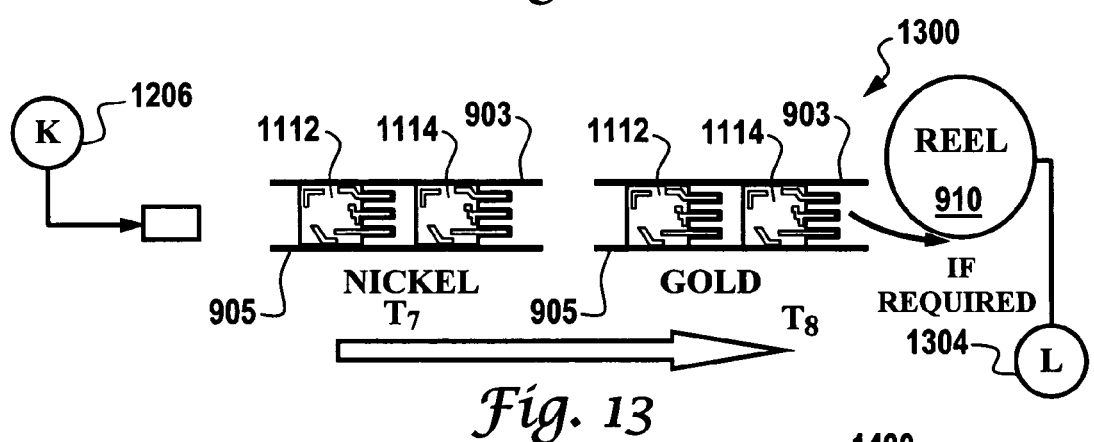
FIG. 13 illustrates a block diagram illustrating in greater detail the build-up operation depicted in FIG. 12, in accordance with an alternative embodiment of the present invention.

FIG. 12 illustrates a block diagram illustrative of a system 1200 that includes build-up operation in association with a reel-to-reel mechanism, in accordance with an alternative embodiment of the present invention. FIG. 13 illustrates a block diagram illustrating a system 1300 that shows in greater detail the build-up operation depicted in FIG. 12, in accordance with an alternative embodiment of the present invention. Reel 910 may be utilized to implement an un-reeling operation. FIG. 12 depicts parts 1112 and 1114 at time T6, immediately prior to the implementation of a build-up operation or process via a build-up module 1204. After base plating, a build-up operation may be implemented to create a final usable circuit upon parts 1112 and 1114.

The process continues from FIG. 12 to FIG. 13, as indicated at continuation block 1206. In the scenario of FIGS. 12 and 13, the build-up process implemented via build-up module 1204 can result in the addition of nickel and gold, as respectively indicated at time $T_7$ and time $T_8$. Such a build-up may allow one continuous reel to attain the final plated configuration or multiple unreeling/reeling operations, depending upon design constraints. Plating may be accomplished by bulk or reel-to-reel processing. All plating processes, such as etching, cleaning, rinsing and plating can be included in the plastic metallization operations of FIGS. 11–13. A reeling operation can be implemented via reel 9102 (i.e., if required). The process then continues to FIG. 14, as indicated at continuation block 1304.

Figure 14:
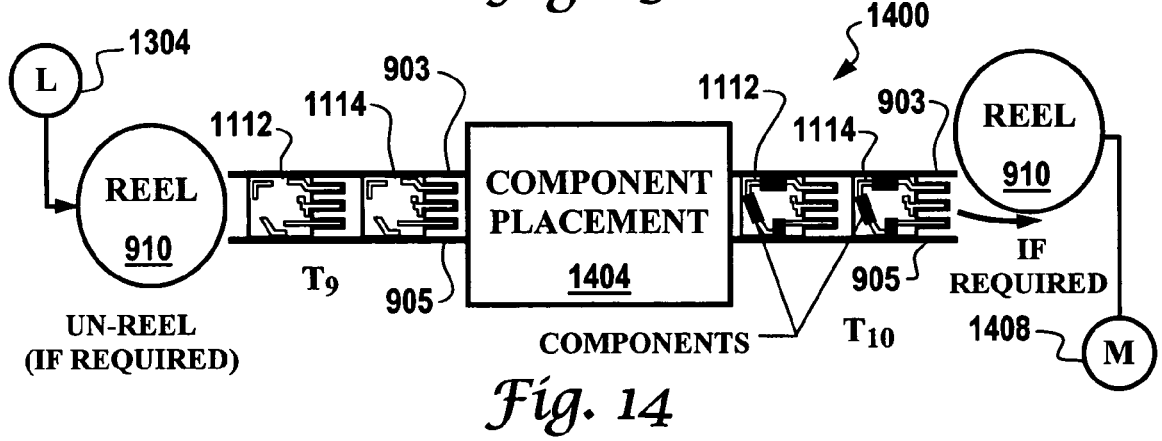
FIG. 14 illustrates a block diagram illustrative of a component placement operation in association with a reel-to-reel mechanism, in accordance with an alternative embodiment of the present invention.

FIG. 14 illustrates a block diagram illustrative of a system 1400 that includes a component placement operation in association with a reel-to-reel mechanism, in accordance with an alternative embodiment of the present invention. Parts 1112 and 1114 are depicted in FIG. 14 at time $T_9$, following implementation (i.e., if necessary) of an un-reeling operation via reel 910. Parts 1112 and 1114 can then be subject to a component placement operation via a component placement module 1404.

Components can be attached to the plastic lead frame structure of parts 1112 and 1114 by a variety of means to establish electrical connections thereof, including techniques such as soldering, conductive adhesion, ultrasonic welding, pressure contact and the like. Parts 1112 and 1114 are next shown at time $T_{10}$, prior to implementation of a reeling operation (i.e., if required) via reel 1910. The process can then continue to FIG. 15 as indicated at continuation block 1408.

Figure 15:
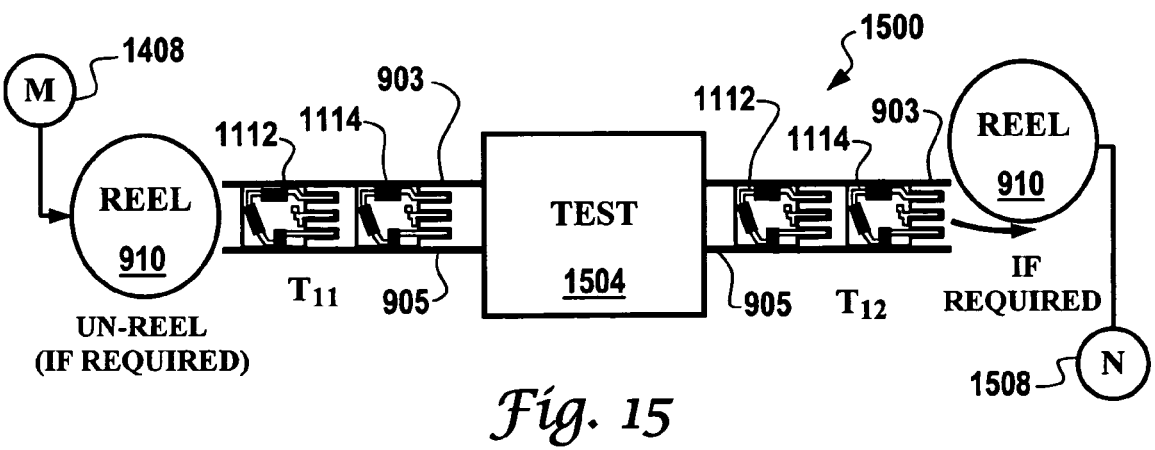
FIG. 15 illustrates a block diagram illustrative of a testing operation in association with a reel-to-reel mechanism, in accordance with an alternative embodiment of the present invention.

FIG. 15 illustrates a block diagram illustrative of a system 1500 that includes a testing operation in association with a reel-to-reel mechanism, in accordance with an alternative embodiment of the present invention. Parts 1112 and 1114 are depicted in FIG. 15 at time $T_{11}$, following a reeling operation (i.e., if required) implemented via reel 1502. Parts 1112 and 1114 can then be subject to a testing operation via a testing module 1504. Testing operations implemented via testing module 1504 can include, for example, tests such as functionality and continuity tests. Parts 1112 and 1114 are then depicted in FIG. 15 at time $T_{12}$, prior to implementation of an un-reeling operation via reel 910. The process then continues to FIG. 16, as indicated at block 1508.

Figure 16:
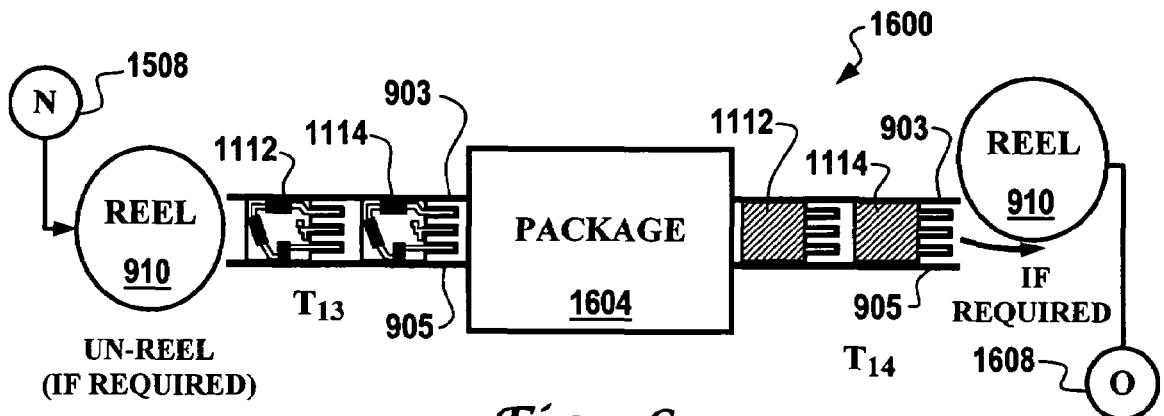
FIG. 16 illustrates a block diagram illustrative of a packaging operation in association with a reel-to-reel mechanism, in accordance with an alternative embodiment of the present invention.

FIG. 16 illustrates a block diagram illustrative of a system 1600 that includes a packaging operation in association with a reel-to-reel mechanism, in accordance with an alternative embodiment of the present invention. An un-reeling operation (i.e., if required) can be implemented via reel 910. Thereafter, at time $T_{12}$, parts 1112 and 1114 are depicted in FIG. 16 prior to implementation of a packaging operation 1604 via a packaging module 1604.

Packaging via packaging module 1604 can take into account a variety of packaging operations including, but not limited to thermal packaging, structure packaging, built-in seals, and vibration isolation. Such an operational package may include more than one manufacturing step and can additionally require the reel at issue to be unspoiled and re-spooled. Parts 1112 and 1114 are then depicted in FIG. 16 at time T14, following completion of the packaging operation(s) via packaging module 1604. Reel 910 can be then be utilized (i.e., if required) to implement a reeling operation. The process can then continue, as indicated at continuation block 1608.

Figure 17:
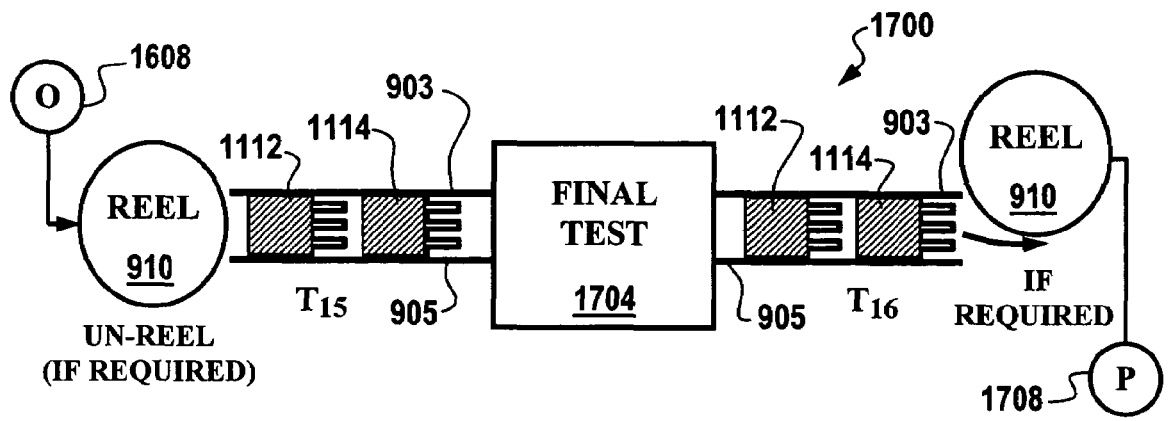
FIG. 17 illustrates a block diagram illustrative of a final testing operation in association with a reel-to-reel mechanism, in accordance with an alternative embodiment of the present invention.

FIG. 17 illustrates a block diagram illustrative of a system 1700 that includes a final testing operation in association with a reel-to-reel mechanism, in accordance with an alternative embodiment of the present invention. Parts 1112 and 1114 are depicted in FIG. 17 at time $T_{15}$, following a reeling operation (i.e., if required) implemented via reel 910. Parts 1112 and 1114 can be subject to one or more testing operations implemented by a testing module 1704. All final testing much be accomplished prior to shipment of the final product. The testing phase accomplished via testing module 1704 can be implemented following singulation. Parts 1112 and 1114 are thereafter depicted in FIG. 17 at time T16, prior to implementation of a reeling operation (i.e., if required) via reel 910. The process then continues to the process depicted in FIG. 18, as indicated at continuation block 1708.

Figure 18:
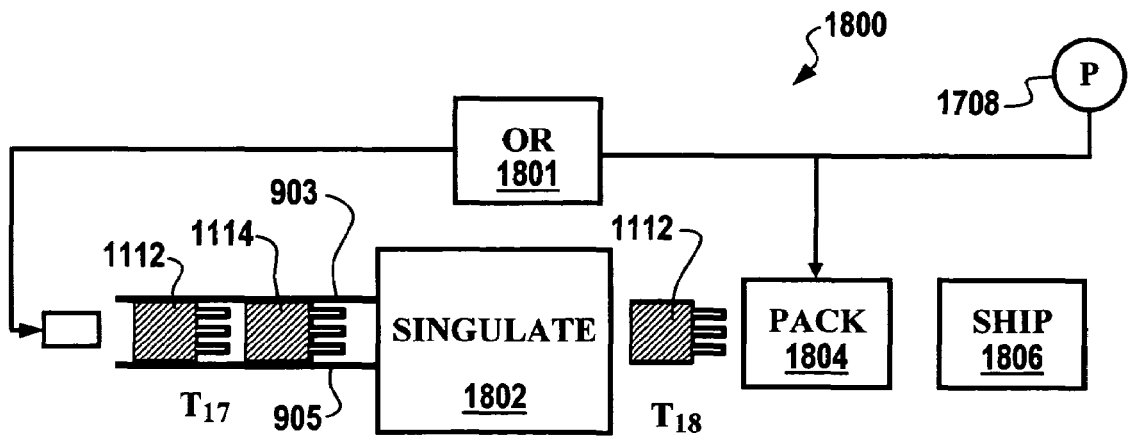
FIG. 18 illustrates a block diagram illustrative of packing and shipping operations, in accordance with an alternative embodiment of the present invention.

FIG. 18 illustrates a block diagram illustrative of a system 1800 that includes packing and shipping operations, in accordance with an alternative embodiment of the present invention. In FIG. 18, an optional "OR" block 1801 is depicted to indicate that the process can continue to a singulation operation via a singulation module 1802 or directly toward packaging via a packaging module 1804 and a packaging module 1806. Note that in FIGS. 9 to 18, systems 900–1800 illustrated therein can constitute an overall system in which parts are reeled/un-reeled, coiled/un-coiled, spooled/unspoiled in and out of various processes implemented respectively via various modules. The desire of the embodiment of FIGS. 9 to 18 is to accomplish an entire manufacturing process with the fewest reel-handling operations as possible. The reels depicted in FIGS. 9 to 18 can be implemented as multiple reels, a single reel, or only two reels, depending upon design constraints and goals. In the alternative embodiment of FIGS. 9 to 18, a dual-plastic process has been substituted for the camera masking operations depicted in the preferred embodiment of FIGS. 1 to 9.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. For example, as utilized herein, the terms sensor, sensing element, IC (integrated circuit), and die can be utilized to refer to silicon circuitry that permits measurement. It is understood that sensing elements other than silicon can also be implemented in accordance with the embodiments disclosed herein.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The embodiments of the invention in which an exclusive property or right is claimed are defined as follows. Having thus described the invention what is claimed is:

1. A manufacturing method, comprising:
   providing a reel-to-reel mechanism that includes at least one reel, wherein said at least one reel is associated with a carrier, such that at least one plastic substrate can be spooled and unspoiled upon said at least one reel prior and subsequent to a performance of a plurality of manufacturing operations upon said at least one plastic substrate; and
   subsequently implementing upon said at least one plastic substrate, said plurality of manufacturing operations, including at least one plastic molding operation and at least one photo-circuit configuring operation utilizing said reel-to-reel mechanism to create said final plastic-based product based initially upon said at least one plastic substrate for the creation of electronic circuitry thereof.

2. The method of claim 1 wherein said at least one circuit configuring operation comprises a plating operation for constructing electronic conductors upon said at least one plastic substrate for the creation of electronic circuitry thereof.

3. The method of claim 1 wherein said at least one circuit configuring operation comprises a sputtering operation for constructing conduction circuitry upon said at least one plastic substrate for the creation of electronic circuitry thereof.

4. The method of claim 1 wherein said plurality of manufacturing operations further comprises at least one of the following manufacturing operations for building an electronics package upon said at least one plastic substrate:
   a component placement operation for placing components upon said at least one plastic substrate;
   a soldering operation for soldering said components;
   a bonding operation for bonding said components; and
   an overmolding operation.

5. The method of claim 1 wherein said plurality of manufacturing operations further comprises at least one of the following manufacturing operations for building an electronics package upon said at least one plastic substrate:
   a package sealing operation for sealing said electronics package;
   an insertion operation for inserting additional components into said electronics package;
   a welding operation for welding said components; and
   a painting operation.

6. The method of claim 1 wherein said plurality of manufacturing operations further comprises at least one of the following manufacturing operations for building an electronics package upon said at least one plastic substrate:
   a plating operation for plating said components to provide conduction thereof upon said at least one substrate;
   a testing operation for testing said electronics package;
   a shipping operation for shipping said electronics package; and
   an assembly packaging operation.

7. The method of claim 1 wherein said carder comprises a material, which permits a transportation of a plurality of plastic substrates for the creation of electronics packages thereon.

8. The method of claim 1 wherein said at least one reel of said reel-to-reel mechanism comprises a plurality of reels for spooling and spooling said at least one plastic substrate upon said carrier.

9. The method of claim 1 further comprising implementing a layout operation for transferring a circuit pattern required to configure said electronic circuitry upon said at least one plastic substrate for the creation of an electronics package thereon.

10. The method of claim 1 wherein said at least one plastic molding operation comprises a utilization of a plurality of molds for the creation of said electronic circuitry thereof.

11. The method of claim 1 further comprising manipulating said at least one plastic substrate, including units thereof, for enhancing manufacturing efficiency.

12. The method of claim 1 wherein said at least one plastic substrate comprises a resin which permits circuitry to be constructed thereupon.

13. A manufacturing method, comprising:
   providing a reel-to-reel mechanism that includes at least one reel, wherein said at least one reel is associated with a carrier, such that at least one plastic substrate can be spooled and unspoiled upon said at least one reel prior and subsequent to a performance of a plurality of manufacturing operations upon said at least one plastic substrate, wherein said at least one reel of said reel-to-reel mechanism comprises a plurality of reels for spooling and spooling said at least one plastic substrate upon said carrier;
   subsequently implementing upon said at least one plastic substrate, said plurality of manufacturing operations, including at least one plastic molding operation and at least one plating operation utilizing said reel-to-reel mechanism to create said final plastic-based product based initially upon said at least one plastic substrate for the creation of electronic circuitry thereof; and
   implementing a photo-circuit layout operation for transferring a circuit pattern required to configure said electronic circuitry upon said at least one plastic substrate for the creation of an electronics package thereon.

* * * * *

UNITED STATES PATENT AND TRADEMARK OFFICE
CERTIFICATE OF CORRECTION

| | | |
|---|---|---|
| PATENT NO. | : 7,134,197 B2 | Page 1 of 1 |
| APPLICATION NO. | : 10/739547 | |
| DATED | : November 14, 2006 | |
| INVENTOR(S) | : Stephen R. Shiffer et al. | |

It is certified that error appears in the above-identified patent and that said Letters Patent is hereby corrected as shown below:

In Column 12, line 21, delete "carder" and add --carrier--.

Signed and Sealed this

Twenty-seventh Day of March, 2007

JON W. DUDAS
*Director of the United States Patent and Trademark Office*